(12) United States Patent
Chanda et al.

(10) Patent No.: US 7,585,764 B2
(45) Date of Patent: Sep. 8, 2009

(54) VIA BOTTOM CONTACT AND METHOD OF MANUFACTURING SAME

(75) Inventors: Kaushik Chanda, Fishkill, NY (US); Lawrence A. Clevenger, LaGrangeville, NY (US); Andrew P. Cowley, Wappingers Falls, NY (US); Jason P. Gill, Essex, VT (US); Baozhen Li, South Burlington, VT (US); Chih-Chao Yang, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 437 days.

(21) Appl. No.: 11/161,599

(22) Filed: Aug. 9, 2005

(65) Prior Publication Data
US 2007/0037403 A1 Feb. 15, 2007

(51) Int. Cl.
*H01L 21/4763* (2006.01)
(52) U.S. Cl. ........................... 438/637; 438/687
(58) Field of Classification Search ................. 438/637, 438/687; 257/E21.576
See application file for complete search history.

(56) References Cited

U.S. PATENT DOCUMENTS

| 5,864,179 A | 1/1999 | Koyama |
| 6,001,415 A | 12/1999 | Nogami et al. |
| 6,180,506 B1 | 1/2001 | Sullivan |
| 6,522,013 B1 | 2/2003 | Chen et al. |
| 6,527,849 B2 | 3/2003 | Dry |
| 2002/0028579 A1 | 3/2002 | Cooney, III et al. |
| 2002/0076574 A1 | 6/2002 | Cabral, Jr. et al. |
| 2002/0162736 A1* | 11/2002 | Ngo et al. .............. 204/192.12 |
| 2003/0036263 A1 | 2/2003 | Lin et al. |
| 2005/0098897 A1 | 5/2005 | Edelstein et al. |
| 2005/0110149 A1* | 5/2005 | Osaka et al. ................. 257/758 |

FOREIGN PATENT DOCUMENTS

JP 2002-64139 2/2002

OTHER PUBLICATIONS

English Language Abstract of JP 2002-64139.

* cited by examiner

*Primary Examiner*—Bradley K Smith
(74) *Attorney, Agent, or Firm*—William D. Sabo; Greenblum & Bernstein P.L.C.

(57) ABSTRACT

A method of fabricating a device includes depositing a electromigration (EM) resistive material in an etched trench formed in a substrate and a wiring layer. The EM resistive material is formed in electrical contact with an underlying diffusion barrier layer and wiring layer. The method further includes forming a via structure in electrical contact with the EM resistive material and the wiring layer. The method results in a structure which prevents an open circuit.

16 Claims, 10 Drawing Sheets

VIA BOTTOM CONTACT AND METHOD OF MANUFACTURING SAME

FIELD OF THE INVENTION

The invention relates generally to a method of manufacturing via bottom contacts and more particularly to via bottom contacts adapted to prevent the sudden opening of a circuit resulting from electromigration (EM) failure and method of manufacture.

BACKGROUND OF THE INVENTION

Void accumulation under contact vias is frequently observed inside an operating semiconductor device. This phenomena can cause the circuit to open as soon as the void size covers the whole via contact area. This failure results from a current density divergence at the contact area and is attributed to a phenomenon of "electromigration" (EM) failure inside the conductive interconnects. More specifically, this phenomena occurs when the conducting material such as, for example, aluminum or copper, migrates or moves away from the contact to form a void between the contact and metal line when a high density current is passed through the circuit. Thus, as the feature size is scaled, the EM problem becomes worse and the accumulation time before an open circuit occurs becomes shorter.

By way of one illustrative example, referring to a top view of FIG. 1, in the case that the contact via and the underneath metal line have comparable CD size, the diffusion barrier around the sidewall of the via will contact the diffusion barrier on the sidewall of the underneath metal. This barrier-to-barrier contact, i.e., barrier redundancy, offers an electrical path when EM failure occurs thus avoiding a sudden opening of the circuit. However, this barrier redundancy feature cannot be reached through a regular process when the contact via size is smaller than the underneath metal line, as shown in a top view of FIG. 2. In this latter case, the circuit will open as soon as the EM failure occurs since there is no redundancy circuitry, i.e., no redundant contact. FIG. 3 shows such a failure of the circuit due to EM failure.

Methods to improve EM resistance have been proposed in many instances. These proposals include, for example, forming an inter metallic region beneath and adjacent a conductive plug through reaction of barrier material with the underneath metal line during a thermal treatment. Additional proposals include forming an electromigration resisting layer through reaction of a correction inhibitor with the underneath metal line during a thermal treatment, as well as forming a copper plug as a reservoir for improving electromigration resistance. Another improvement in this area includes forming a Cu—Zn alloy along the surface of copper interconnects for improving electromigration resistance.

SUMMARY OF THE INVENTION

In a first aspect of the invention, a method of fabricating a device includes depositing a electromigration (EM) resistive material in an etched trench formed in a substrate and a wiring layer. The EM resistive material is formed in electrical contact with an underlying diffusion barrier layer and wiring layer. The method further includes forming a via structure in electrical contact with the EM resistive material and the wiring layer.

In another aspect of the invention, the method of fabricating a device includes forming a wiring layer in a substrate confined at least partially within a diffusion barrier material. An insulator layer is provided over the wiring layer and portions of the substrate. The method further includes etching the insulator layer and the wiring layer to the diffusion barrier material. A diffusion barrier layer is provided in the etched portion of the insulator and in contact with the diffusion barrier material. A via structure is formed at least partially confined and in electrical communication with the diffusion barrier layer.

In a further aspect of the invention, a structure includes a via structure confined by a diffusion barrier material extending within a lower level wiring layer and in contact with a diffusion material surrounding the lower level wiring layer.

DESCRIPTION OF EMBODIMENTS OF THE INVENTION

The invention relates to a method of manufacturing via bottom contacts and more particularly to via bottom contacts adapted to prevent the sudden opening of the circuit resulting from electromigration (EM) failure and a method of manufacturing such a structure or device. In the invention, an interconnect structure is designed to avoid a sudden open circuit after EM failure by utilizing a redundancy connection. By using the invention, there is sufficient time for chip replacement or system operation adjustment after receiving a warning signal of EM failure from a monitor device. The system and method of the invention is also easy to implement in current processing stages.

Figure 1:
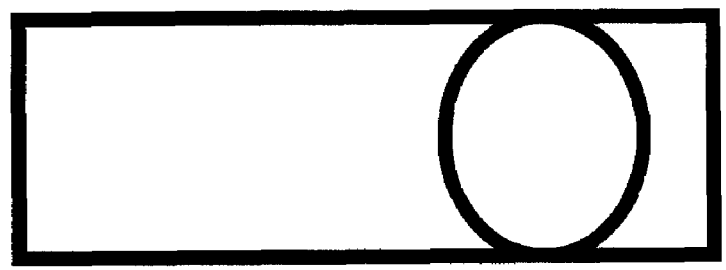
FIG. 1 shows a top view of contact via and an underlying metal line with comparable CD size.
Figure 2:
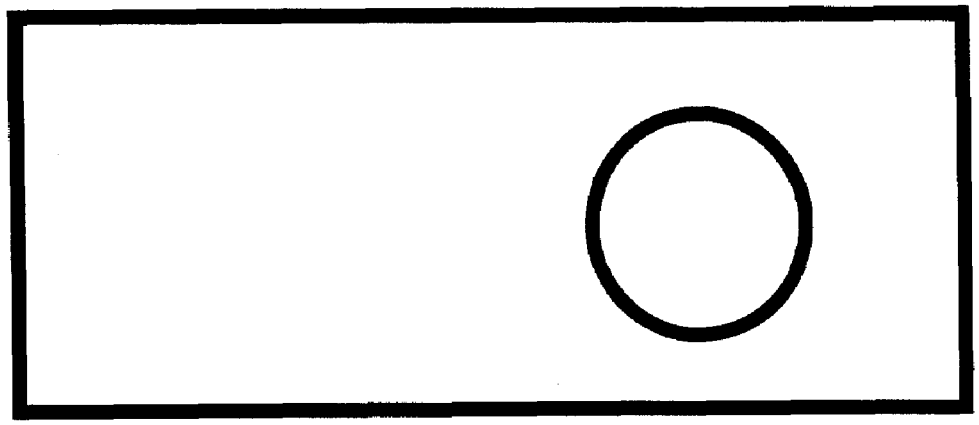
FIG. 2 shows a top view of contact via with a smaller CD size than that of an underlying metal line.
Figure 3:
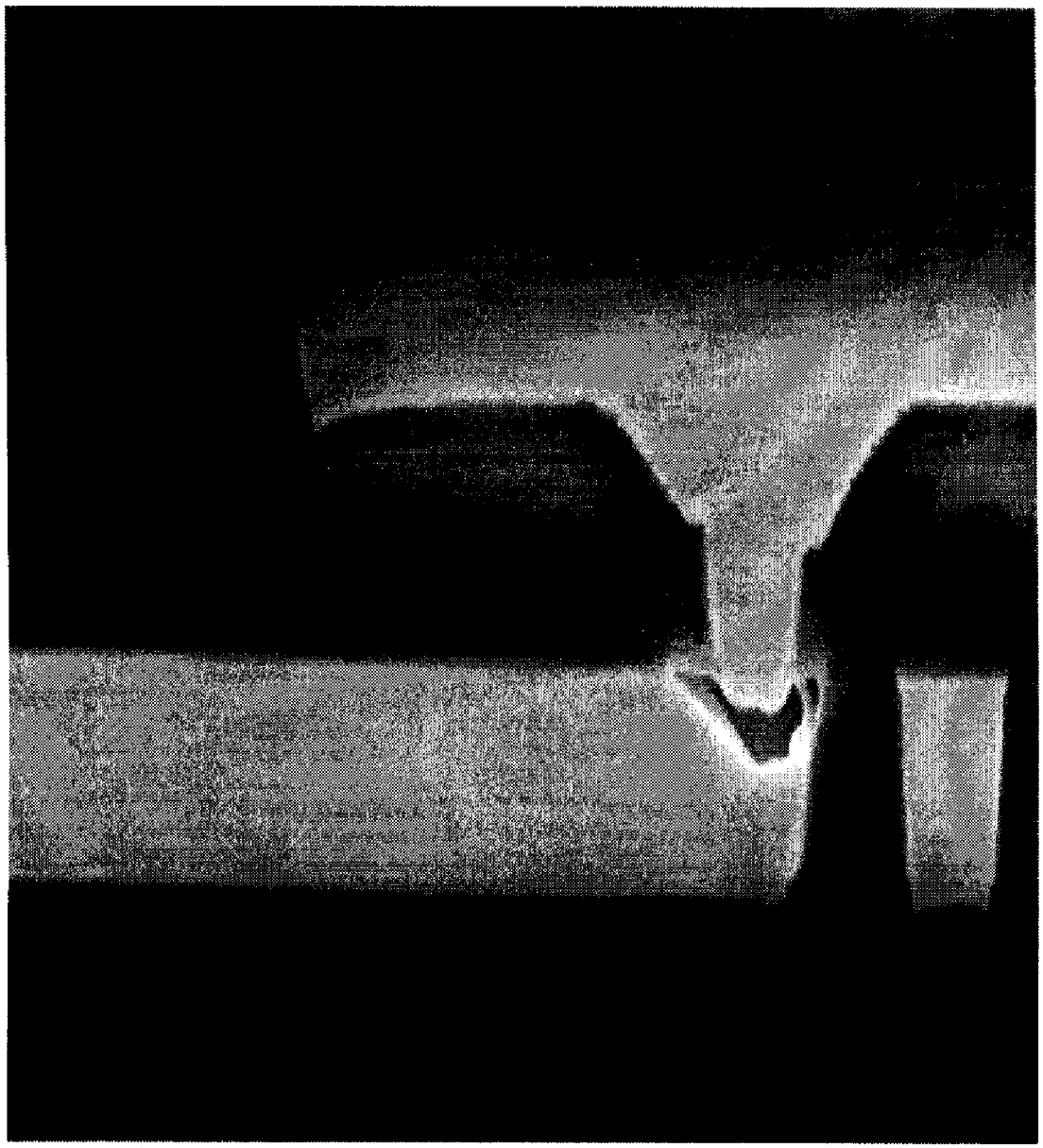
FIG. 3 shows an open circuit due to electromigration (EM) failure.
Figure 4:
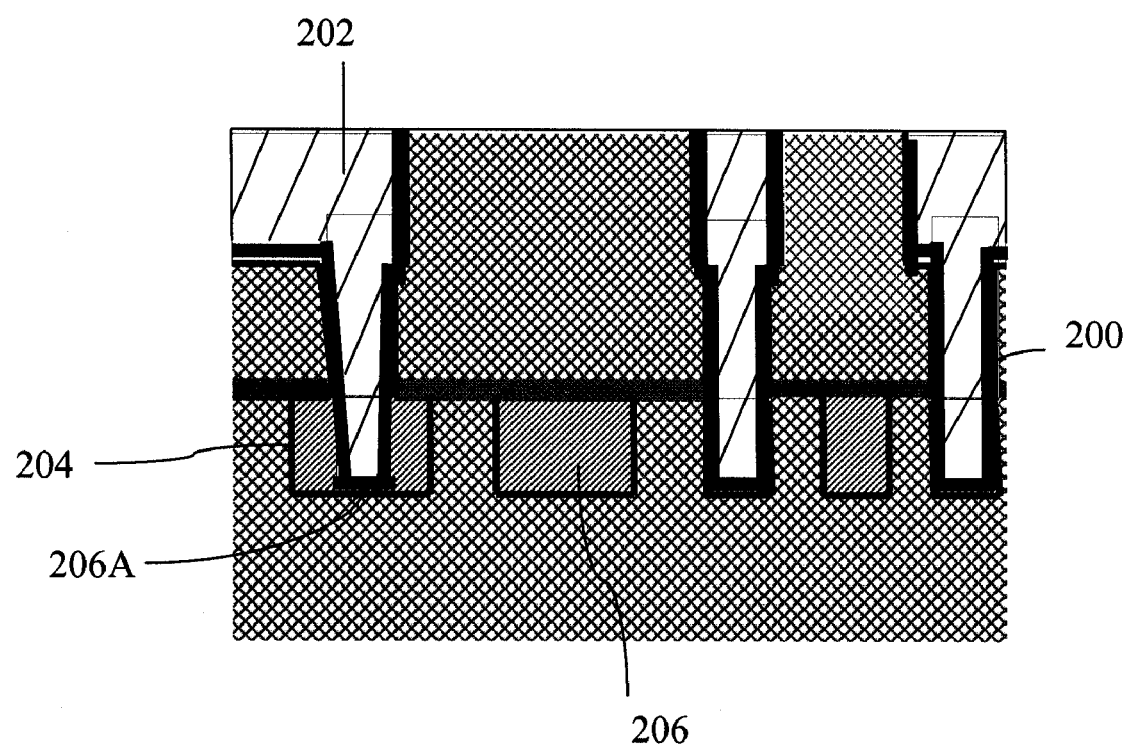
FIG. 4 shows a final structure in accordance with the invention.

Referring to FIG. 4, a final structure, in cross-section, implemented using the method of the invention is shown. In this structure, the interconnect structure includes a via-bottom contact for preventing a sudden open circuit caused by EM failure. More particularly, in the structure of FIG. 4, a diffusion barrier material(s) 200 such as, for example, titanium nitride or other known materials, used in the upper level contact(s) 202 is placed in contact with a diffusion material(s) 204 used in previous wiring or metal line 206. The upper level contacts may include a via connection and an upper wiring layer, for example. This is accomplished by extending the contact via to the bottom 206a of the underneath metal line 206 (and to the upper wiring layer, in embodiments).

In the manner described, both diffusion barrier materials, 200 and 204, are electrical conductive and have high EM resistance, which results in an electrical path between the interconnect levels or layers 202 and 206. The interconnect level 202 may include the via and an upper wiring layer, whereas, the interconnect level 206 may include a lower wiring layer. This electrical conductive path prevents a sudden circuit open resulting from Cu EM failure around the via. This barrier-redundancy feature also offers a sufficient time for chip replacement or system operation adjustment after EM failure has been detected by a monitor device. This same process can be used regardless of the contact via size, e.g., the contact via being smaller than or equal in size to that of the underneath metal layer 206.

In the structure of FIG. 4, the resistivity of the diffusion barrier materials 200 and 204 is greater than that of the wiring or interconnect layers or levels 202 and 206. For example, titanium nitride, used for the diffusion barrier layer 204, in one illustrative example, has a higher electrical resistivity than that of copper or aluminum, used for the interconnect layers or levels 202 and 206. Thus, when the copper migrates, for example, due to EM (caused by high currents), the diffusion barrier layers 200 and 204 will remain in contact thus preventing a sudden open circuit, e.g., failure of the circuit.

Figure 5:
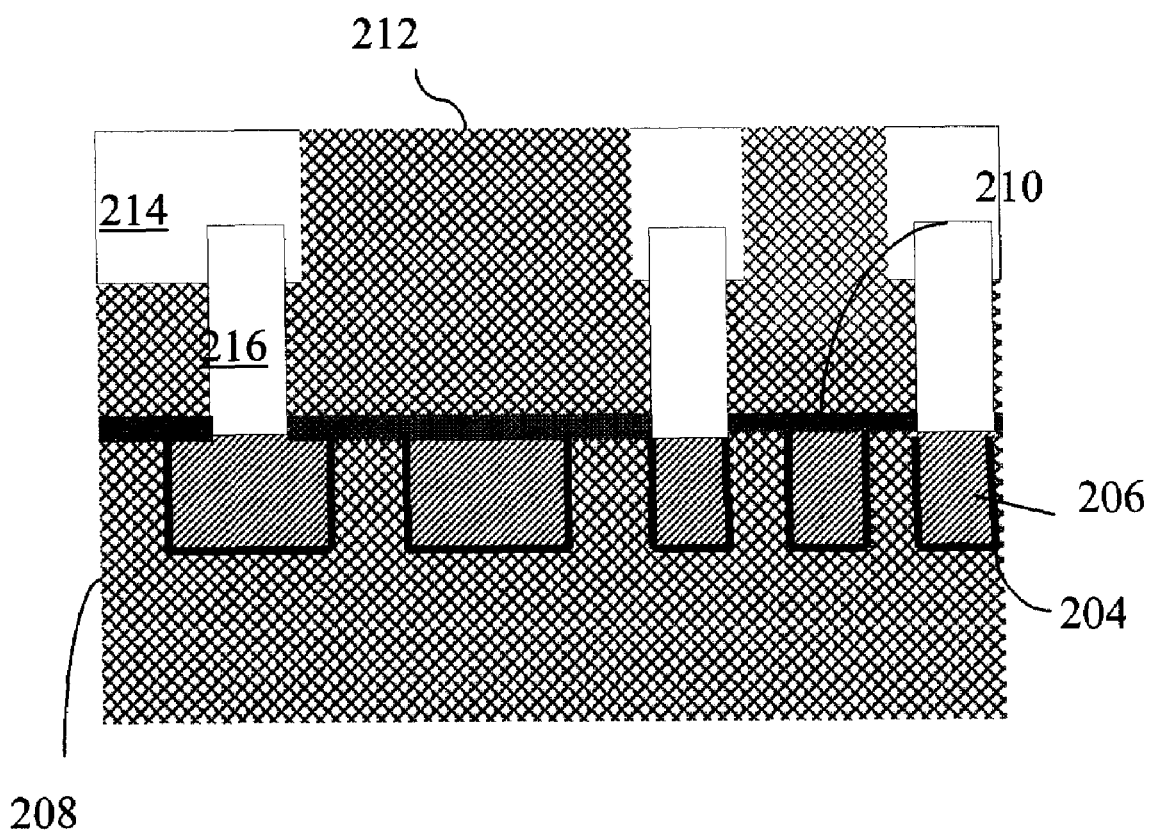
FIGS. 5-10 show process steps in accordance with the invention.

The method for forming an interconnect structure in accordance with the invention is shown in FIGS. 5-10. In FIG. 5, a patterned wiring structure, e.g., metal line, 206 is formed in a substrate 208 in a conventional manner. The patterned interconnect wiring 206 may be of various sizes and shapes, none of which are limiting to the invention. In one implementation, the diffusion barrier material or layer 204 is formed between the patterned wiring structure 206 and the substrate 208, in a conventional fabrication process. Basically, in such a conventional process, the patterned wiring structure 206 is confined within the diffusion barrier material 204. In one embodiment, the patterned wiring structure 206 may be, for example, copper or aluminum or other conductive material which has a lower resistivity than that of the diffusion barrier material 204. The diffusion barrier material 204 may be, for example, titanium nitride.

Still referring to FIG. 5, the patterned wiring structure 206 and the surface of the substrate 208 is capped with a dielectric material 210. The dielectric material 210 may be, for example, nitride, silicon nitride or silicon carbide doped with nitrogen and hydrogen to name a few materials. A second or more insulator layer(s) 212 may then be deposited on top of the dielectric material 210, in addition to the previous patterned wiring structure 206, in conventional processes. Conventional lithographic and etching processes is performed to pattern a second patterned wiring structure 214 and a via or contact level 216 in the insulator layer 212.

Figure 6:
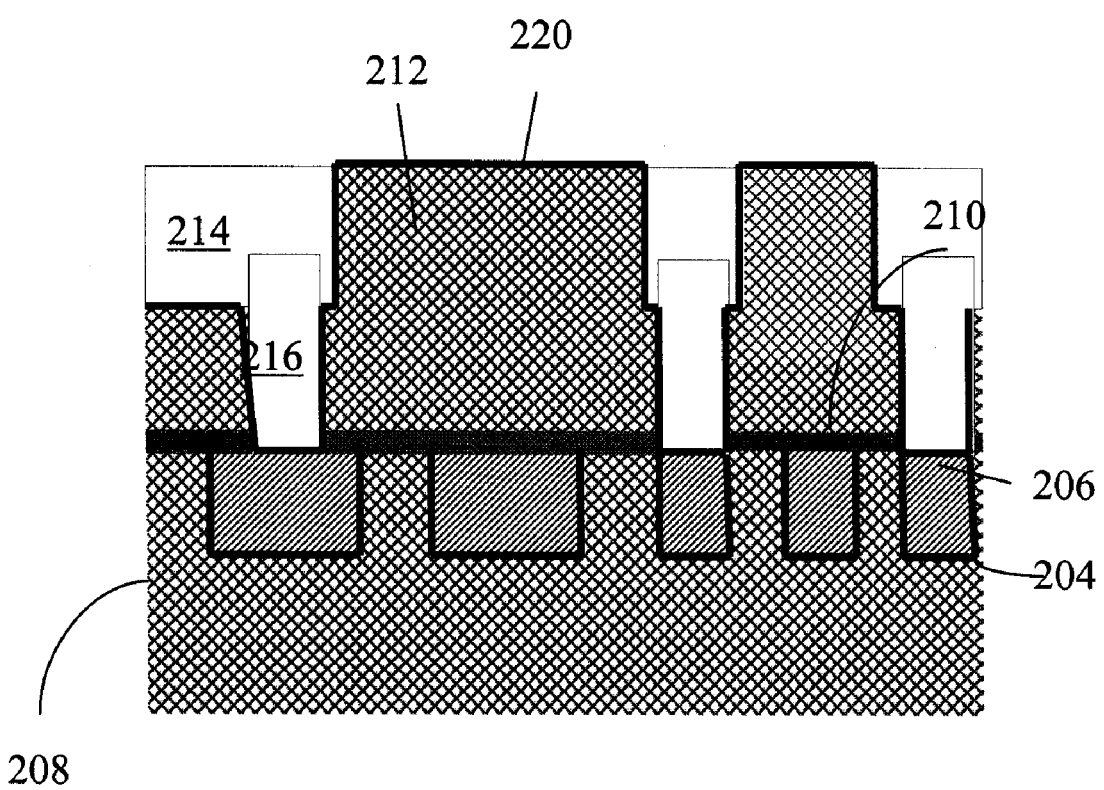

In FIG. 6, an electrical conductive material 218 with high EM resistance is deposited on the patterned wafer surface. This electrical conductive material (e.g., liner) 218 may be used as a diffusion barrier and may include any one or more of the materials selected from the group comprising TaN, Ta, Ti, Ti(Si)N, Ru, Ir or W (which may be also used for other diffusion layers). The thickness of the one or more conductive layers 218 deposited on the structure is in the range 10 Angstroms to 500 Angstroms. This process can be performed through a conventional PVD, CVD, or ALD deposition process.

Figure 7:
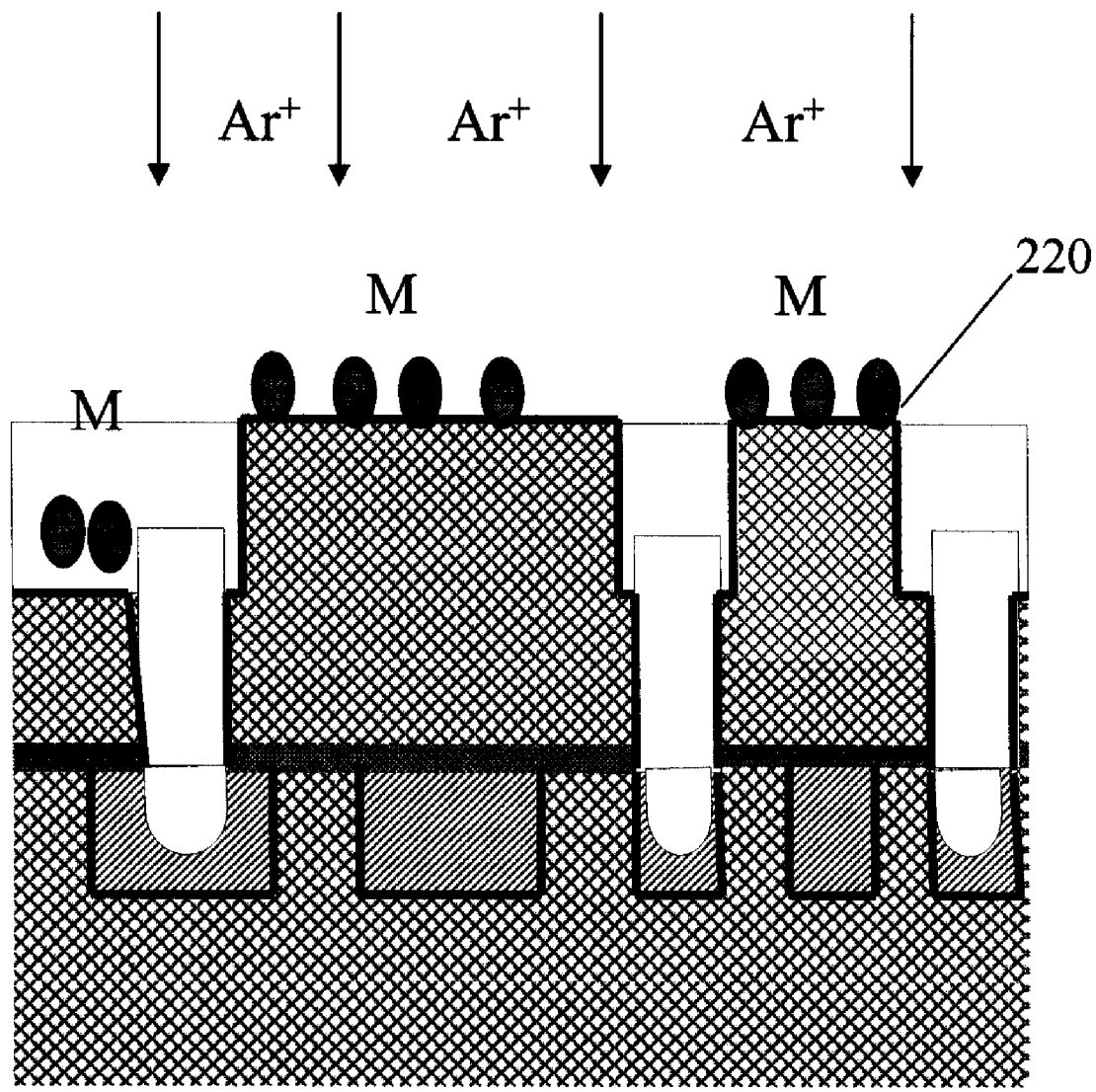

In FIG. 7, following the initial metal film deposition, the wafer may remain in the same deposition chamber in order to begin the process of a directional gaseous bombardment with deposition of metal neutral 220, simultaneously. In this stage, a sputter etching process uses a gas selected from the group of Ar, He, Ne, Xe, $N_2$, $H_2$, $NH_3$ and $N_2H_2$. The method of metal neutral deposition on a target, comprising depositing, in situ, metal neutral 220 during a directional gaseous bombardment may be used to remove native oxide on an underneath metal conductor surface. In one embodiment, the metal neutral 220 can be the same material as the target or include one or more materials of the group consisting of Ta, Ti, or W. In this stage of processing, some of the metal, of the patterned structure 206, will be removed.

Figure 8:
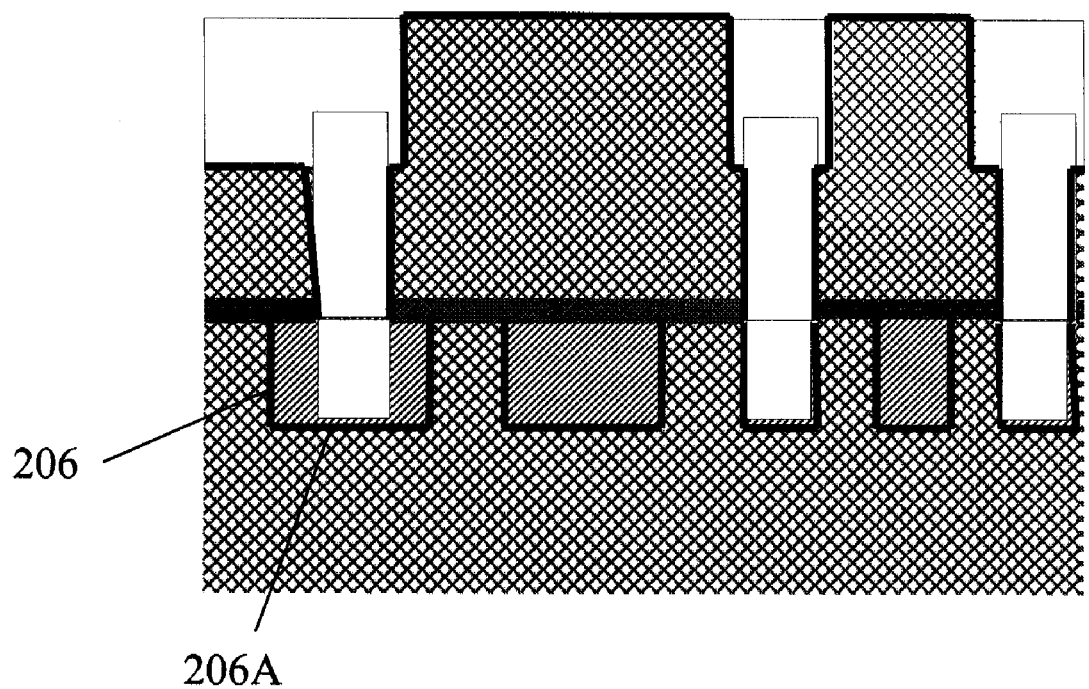

As seen in FIG. 8, the sputter etch proceeds to a depth which exposes the bottom surface 206a of the underneath patterned wiring structure 206, e.g., metal conductor. As with the description of FIG. 7, a positive etching rate may be achieved at the via bottom 206a while depositing the second material (metal neutral) 220 on top of the first metal at other areas, i.e., field, trench bottom, and tapered sidewall. In this manner, the patterned wiring structure 206 is etched to the diffusion layer 204.

Figure 9:
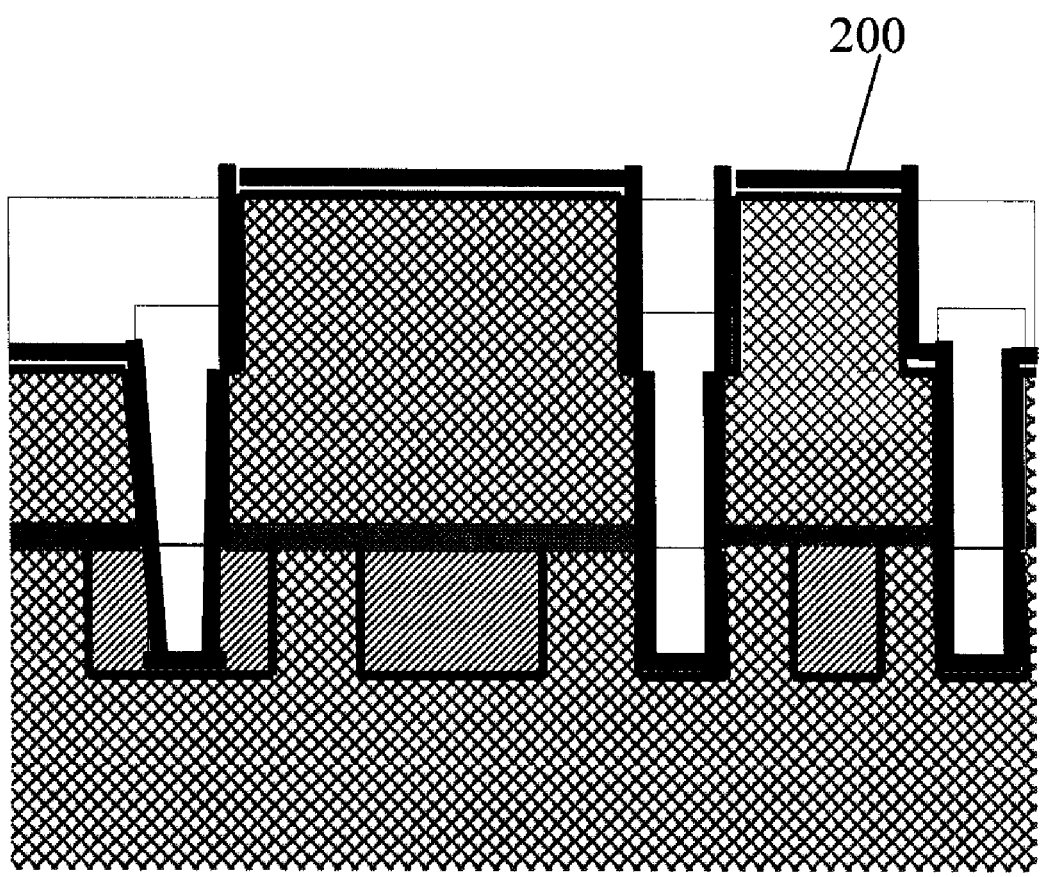

In FIG. 9, following the gaseous sputtering on the patterned wafer, further liner or seed layer materials 200 may be deposited, which may include TaN, Ta, Ti, TiN, W, Cu, or other suitable materials. The layer(s) 200 will extend to the bottom 206a of the etched wiring structure 206 to form a contact (as shown in FIG. 4 as reference numeral 200). The thickness of the one or more layers 200 deposited on the structure is in the range of approximately 10 Angstroms to 500 Angstroms, as one example. This process can be performed through a conventional PVD, CVD, or ALD deposition process.

Figure 10:
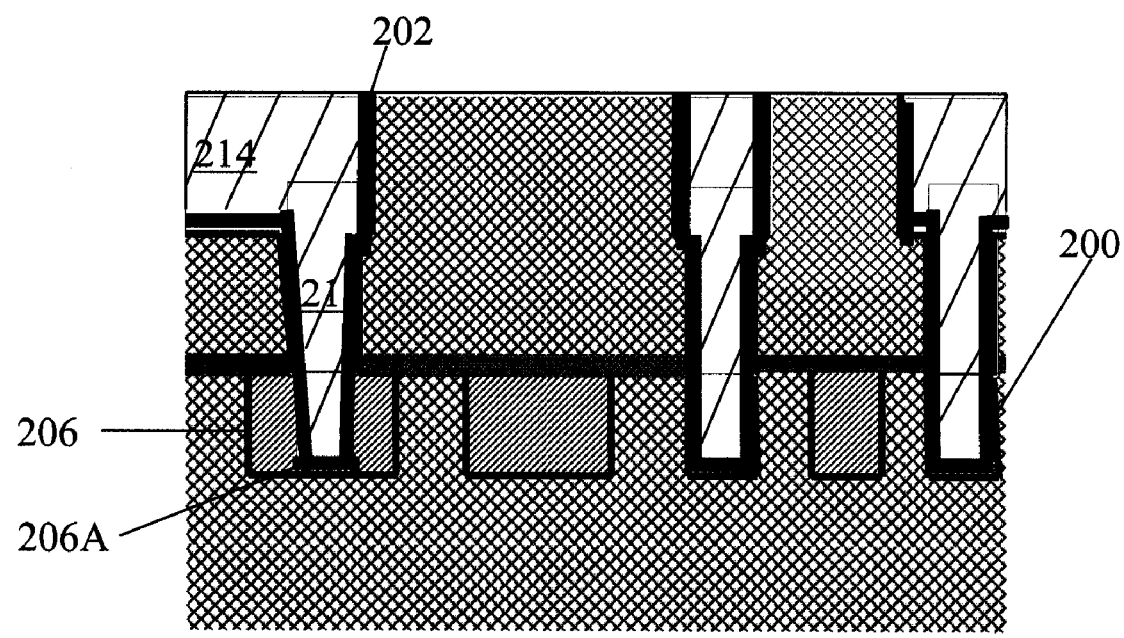

As represented by FIG. 10, conventional electrical Cu plating and chemical mechanical polishing processes are used to complete the build of the interconnect.

Figure 11A:
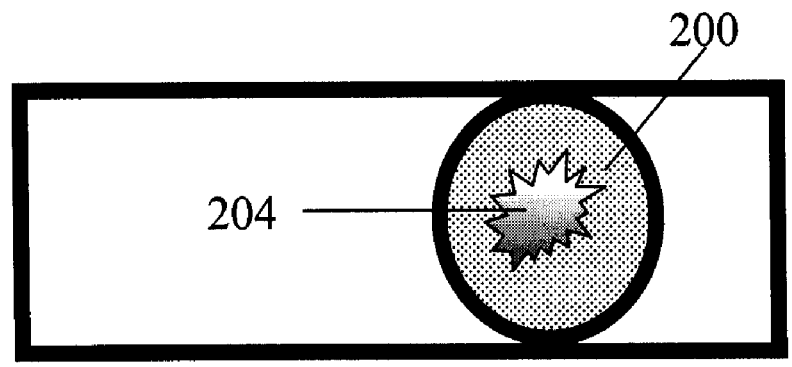
FIGS. 11a and 11b are top views of a structure in accordance with the invention.
Figure 11B:
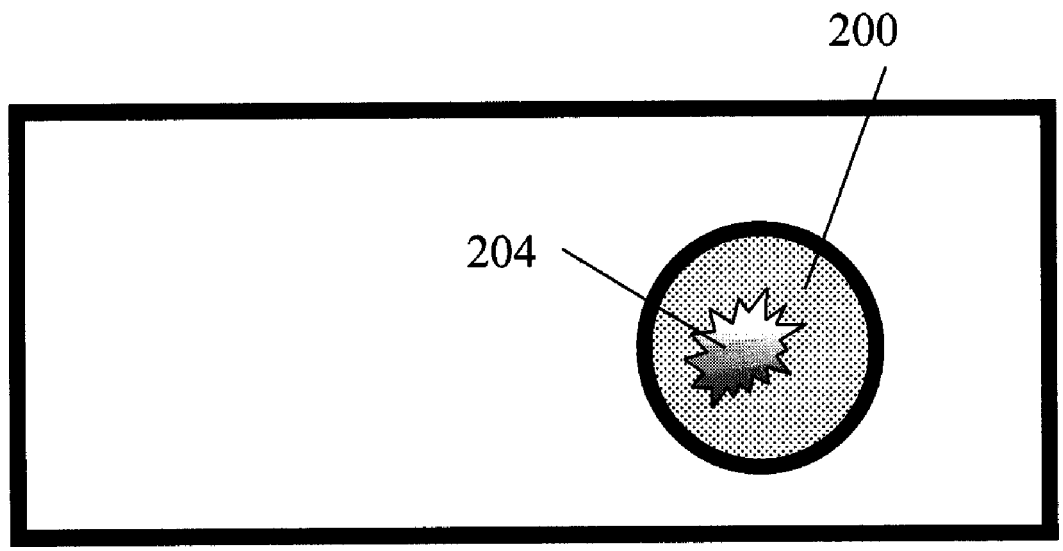

FIGS. 11a and 11b are top views of the structure in accordance with the invention. As shown in FIGS. 11a and 11b, the diffusion barrier material or layer 200 is in contact with the diffusion barrier material 204, regardless of the comparative sizes of the via and underneath metal wire layer. By way of illustration, in FIG. 11a, in the case that the contact via and the underneath metal line have comparable CD size, the diffusion barrier 200 around the sidewall of the via will contact the diffusion barrier 204 on the sidewall of the underneath metal line, in addition to the diffusion layer 204 at the bottom of the underneath metal line. By way of further illustration, in FIG. 11b, in the case that the contact via is smaller than the underneath metal line, the diffusion barrier 200 of the contact via will contact the diffusion barrier 204 at the bottom of the underneath metal line.

While the present invention has been described with reference to exemplary embodiments, changes may be made, within the purview of the appended claims, without departing from the scope and spirit of the present invention in its aspects. Thus, although the present invention has been described herein with reference to particular materials and embodiments, the present invention is not intended to be limited to the particulars disclosed herein; rather, the present invention extends to all functionally equivalent structures, methods and uses, such as are within the scope of the appended claims.

What is claimed is:

1. A method of fabricating a device, comprising:
    forming a wiring layer in a substrate confined at least partially within a diffusion barrier material, wherein the diffusion barrier material comprises a base layer portion beneath the wiring layer and side layer portions adjacent the wiring layer;
    providing an insulator layer over the wiring layer and portions of the substrate;
    etching the insulator layer and the wiring layer to the base layer of the diffusion barrier material;
    depositing a electromigration (EM) resistive material in an etched trench formed in the substrate and the wiring layer, the EM resistive material being formed in electrical and physical contact with all of the base layer portion and in electrical and physical contact with the side layer portions of the diffusion barrier material and the wiring layer; and
    forming a via structure in electrical contact with the EM resistive material and the wiring layer.

2. The method of claim 1, wherein the wiring layer has a lower resistivity than the diffusion barrier material.

3. The method of claim 1, further comprising at least partially capping the wiring layer with a dielectric material.

4. The method of claim 3, wherein the dielectric material is nitride, silicon nitride or silicon carbide doped with nitrogen and hydrogen.

5. The method of claim 1, further comprising providing a second wiring layer in an insulator layer and in electrical contact with the via structure and the EM resistive material.

6. The method of claim 5, further comprising depositing an electrical conductive material with high electromigration (EM) resistance in the etched portion of an insulator layer forming a pattern for the via structure.

7. The method of claim 6, wherein the electrical conductive material is a diffusion barrier and includes any one or more of the materials selected from the group comprising TaN, Ta, Ti, Ti(Si)N, Ru, Ir or W.

8. The method of claim 1, wherein the etching is a sputter etching using a gas selected from the group of Ar, He, Ne, Xe, $N_2$, $H_2$, $NH_3$ and $N_2H_2$.

9. A method of fabricating a device, comprising:
   forming a wiring layer in a substrate confined at least partially within a diffusion barrier material, wherein the diffusion barrier material comprises a base layer portion beneath the wiring layer and side layer portions adjacent the wiring layer;
   providing an insulator layer over the wiring layer and portions of the substrate;
   etching the insulator layer and the wiring layer to the base layer portion of the diffusion barrier material;
   providing a diffusion barrier layer in the etched portion of the insulator and in electrical and physical contact with all of the base layer portion and in contact with the side layer portions of the diffusion barrier material; and
   forming a via structure at least partially confined within and in electrical communication with the diffusion barrier layer.

10. The method of claim 9, wherein the wiring layer has a lower resistivity than the diffusion barrier material.

11. The method of claim 9, further comprising at least partially capping the wiring layer and the substrate with a dielectric material.

12. The method of claim 11, wherein the dielectric material is nitride, silicon nitride or silicon carbide doped with nitrogen and hydrogen.

13. The method of claim 9, further comprising patterning a second wiring layer in the insulator layer and forming a second wiring in the patterned insulator in electrical contact with the diffusion barrier layer.

14. The method of claim 9, further comprising depositing an electrical conductive material with high electromigration (EM) resistance on the etched portion of the insulator layer.

15. The method of claim 14, wherein the electrical conductive material is a diffusion barrier and includes any one or more of the materials selected from the group comprising TaN, Ta, Ti, Ti(Si)N, Ru, Ir or W.

16. The method of claim 9, wherein the etching is a sputter etching using a gas selected from the group of Ar, He, Ne, Xe, $N_2$, $H_2$, $NH_3$ and $N_2H_2$.

* * * * *

UNITED STATES PATENT AND TRADEMARK OFFICE
CERTIFICATE OF CORRECTION

PATENT NO. : 7,585,764 B2  Page 1 of 1
APPLICATION NO. : 11/161599
DATED : September 8, 2009
INVENTOR(S) : Chanda et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 832 days.

Signed and Sealed this

Fourteenth Day of December, 2010

David J. Kappos
*Director of the United States Patent and Trademark Office*